(12) United States Patent
Chen et al.

(10) Patent No.: US 7,081,419 B2
(45) Date of Patent: Jul. 25, 2006

(54) GATE DIELECTRIC STRUCTURE FOR REDUCING BORON PENETRATION AND CURRENT LEAKAGE

(75) Inventors: Yuan Chen, Orlando, FL (US); Feng Li, Orlando, FL (US); Yi Ma, Orlando, FL (US); Kurt G. Steiner, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/847,789

(22) Filed: May 18, 2004

(65) Prior Publication Data

US 2004/0238905 A1 Dec. 2, 2004

Related U.S. Application Data

(62) Division of application No. 09/605,931, filed on Jun. 28, 2000, now abandoned.

(51) Int. Cl.
*H01L 21/31* (2006.01)
(52) U.S. Cl. ..................... 438/769; 257/411
(58) Field of Classification Search ............... 438/264, 438/287, 585, 591, 769–772, 775–778, 786–787, 438/791; 257/410–411, 701, 760
See application file for complete search history.

(56) References Cited

U.S. PATENT DOCUMENTS

| 3,793,909 | A |  | 2/1974 | Barile et al. |
| 4,051,273 | A |  | 9/1977 | Abbas et al. |
| 4,151,537 | A | * | 4/1979 | Goldman et al. ........... 257/324 |
| 4,910,779 | A |  | 3/1990 | Cooper et al. |
| 4,980,307 | A |  | 12/1990 | Ito et al. |
| 5,319,229 | A |  | 6/1994 | Shimoji et al. |
| 5,464,783 | A | * | 11/1995 | Kim et al. ................... 438/591 |
| 5,500,900 | A |  | 3/1996 | Chen et al. |
| 5,837,598 | A |  | 11/1998 | Aronowitz et al. |
| 6,037,651 | A |  | 3/2000 | Hasegawa |
| 6,262,455 | B1 |  | 7/2001 | Lutze et al. |
| 6,309,932 | B1 | * | 10/2001 | Ma et al. ..................... 438/287 |
| 6,348,420 | B1 | * | 2/2002 | Raaijmakers et al. ........ 438/769 |
| 6,399,520 | B1 | * | 6/2002 | Kawakami et al. .......... 438/778 |

OTHER PUBLICATIONS

Parent case U.S. Appl. No. 09/605,931 entitled "A Novel Gate Dielectric Structure for Reducing Boron Penetration and Current Leakage," to Yuan Chen, et al., filed on Jun. 28, 2000 currently pending.

* cited by examiner

*Primary Examiner*—David Vu

(57) ABSTRACT

The present invention provides a semiconductor device capable of substantially retarding boron penetration within the semiconductor device and a method of manufacture therefor. In the present invention the semiconductor device includes a gate dielectric located over a substrate of a semiconductor wafer, wherein the gate dielectric includes a nitrided layer and a dielectric layer. The present invention further includes a nitrided transition region located between the dielectric layer and the nitrided layer and a gate located over the gate dielectric.

23 Claims, 5 Drawing Sheets

100

200

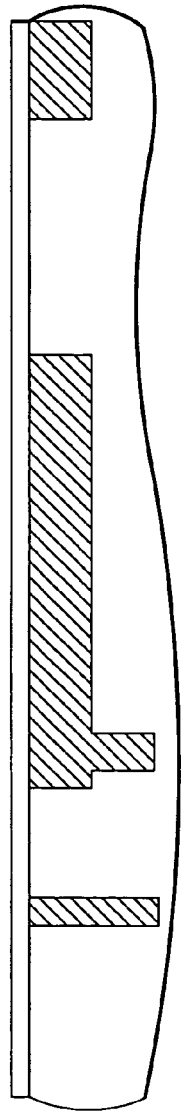
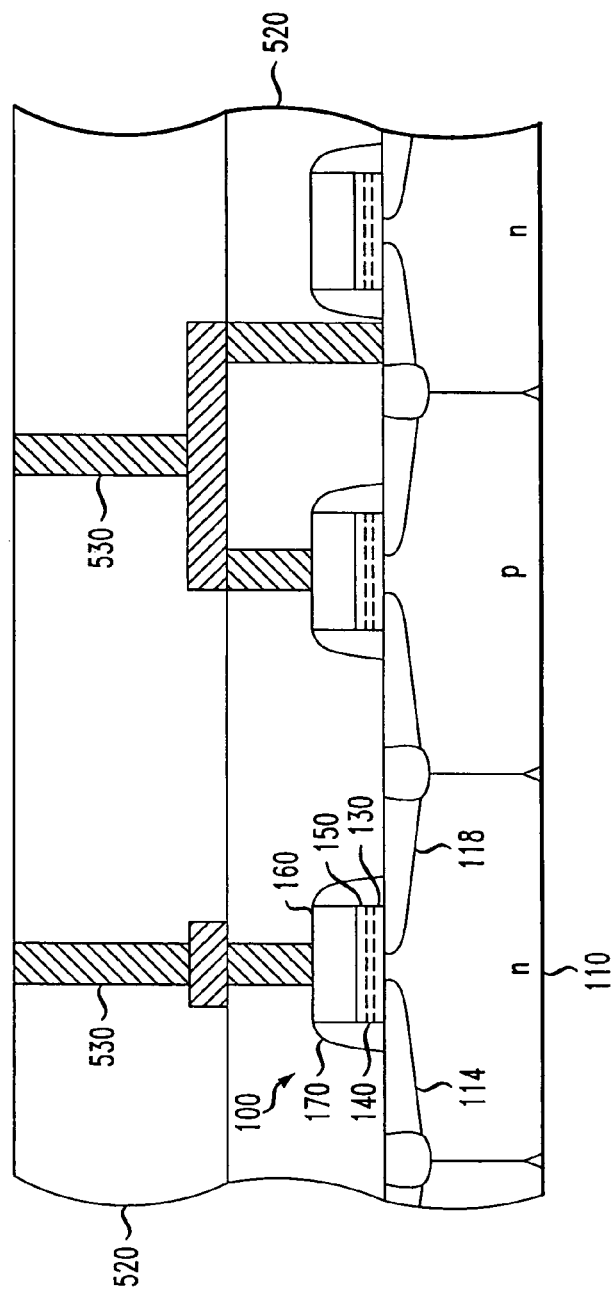
FIG. 5
500

GATE DIELECTRIC STRUCTURE FOR REDUCING BORON PENETRATION AND CURRENT LEAKAGE

This Application is a Divisional of prior application Ser. No. 09/605,931 entitled "A NOVEL GATE DIELECTRIC STRUCTURE FOR REDUCING BORON PENETRATION AND CURRENT LEAKAGE," to Yuan Chen, et al., filed on Jun. 28, 2000 now abandoned. The above-listed Application is commonly assigned with the present invention and is incorporated herein by reference as if reproduced herein in its entirety under Rule 1.53(b).

TECHNICAL FIELD OF THE INVENTION

The present invention is directed, in general, to a semiconductor device and, more specifically, to a semiconductor device having a nitrided transition region located between a dielectric layer and a nitrided layer, that substantially retards boron penetration and current leakage, and a method of manufacture therefor.

BACKGROUND OF THE INVENTION

The fabrication of metal-oxide-semiconductor (MOS) transistors within a semiconductor substrate is well known. These MOS transistors include a plurality of polysilicon gate structures that are formed over lightly doped drain implants that are conducted to form source and drain regions. After formation of the polysilicon gates, a source/drain implant is then performed to complete the source/drain regions. In a p-type channel MOS device, boron is most often used to implant the source/drain regions.

As transistor channels shrink below 50 nm the limitations of conventional transistor processing, associated with such boron implants, has become more apparent. To combat short channel effects in these transistors, the depth of the source/drain junctions and more importantly the thicknesses of the gate oxide has been reduced. However, as the gate oxide thickness has decreased, devices have become more susceptible to diffusion of boron dopants through the gate oxide and into the active area of the transistor. The presence of these dopants within the channel region, can undesirably alter the threshold voltage of the device and may cause the device to be unstable due to threshold voltage drifting. This problem is especially acute for boron implanted gate structures.

In addition to reliability concerns, thin gate oxides present significant manufacturing challenges as well. The uniformity of the gate dielectric film across the wafer has become more critical as the film thickness has decreased. A 0.2 nm variation in film thickness across a wafer is far more significant in a 2 nm film than in a 5 nm film.

In the past, the semiconductor manufacturing industry attempted to prevent boron penetration within transistor structures in two ways. The first way includes manufacturing the transistor structure containing an oxide/nitride stack. The concept is to put a silicon nitride layer between an oxide layer and a poly gate layer. If the silicon nitride layer has a minimum thickness of 0.7 nm, the boron penetration tends to be retarded. However, at silicon nitride thicknesses less than 0.7 nm, which is the current trend, the boron continues to penetrate into the active device regions. Moreover, an interfacial charge of about $1E11/cm^2$ is present at the silicon nitride and oxide interface. When the silicon nitride and oxide are thick, this is not a problem; however, as the thickness of the gate oxide continues to decrease, this interfacial charge decreases device performance and may even cause the device to malfunction completely.

A second way the semiconductor manufacturing industry has attempted to reduce boron penetration, while continually decreasing the oxide thickness, is to grow a silicon dioxide layer as the gate oxide and anneal the silicon dioxide layer with nitrous oxide and heat. The method prevents boron from penetrating into the active device region; however, because the oxygenated region is at the interface between the silicon substrate and the silicon dioxide layer, the boron penetrates deep enough to cause device mobility problems. Likewise, as discussed above, an interfacial charge of about $5E10/cm^2$ is present at the silicon dioxide silicon substrate interface, which also affects the device performance.

Accordingly, what is needed in the art is a transistor device having a structure sufficient to prevent boron penetration from the poly gate to the active device regions without experiencing the problems that the prior art transistor structures experience during boron doping of the poly gate.

SUMMARY OF THE INVENTION

To address the above-discussed deficiencies of the prior art, the present invention provides a semiconductor device capable of substantially retarding boron penetration and reducing leakage current, within the semiconductor device, and a method of manufacture therefor. In the present invention the semiconductor device includes a gate dielectric located over a substrate of a semiconductor wafer, wherein the gate dielectric includes a nitrided layer and a dielectric layer. The present invention further includes a nitrided transition region located between the dielectric layer and the nitrided layer, and a gate located over the gate dielectric.

In an illustrative embodiment the dielectric layer is a silicon dioxide layer, the nitrided layer is a silicon nitride layer and the nitrided transition region is an oxynitride transition region. Moreover, in another illustrative embodiment, the oxynitride transition region inhibits a diffusion of boron therethrough. In various embodiments, the nitrided layer may have a thickness ranging from about 0.25 nm to about 1.0 nm and the dielectric layer may have a thickness ranging from about 0.5 nm to about 2.0 nm.

In one advantageous embodiment, the nitrided transition region is formed by subjecting the substrate to a high pressure oxidation process. In another aspect of this particular advantageous embodiment, the high pressure oxidation process is conducted at a pressure substantially greater than 1 atmosphere, and in a more advantageous embodiment at a pressure ranging from about 5 atmosphere to about 25 atmosphere, and preferably about 25 atmosphere.

Further included in the present invention, is an integrated circuit and a method of manufacture therefor. The integrated circuit, in an exemplary embodiment, includes the semiconductor device described above, including its various embodiments, and interconnects contacting the semiconductor device to form the integrated circuit.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURES. It is emphasized that in accordance with the standard practice in the semiconductor industry the various features are not drawn to scale. In fact, the dimensions of the various features may be arbitrarily increased or reduced for clarity of discussion. Reference is now made to the following descriptions taken in conjunction with the accompanying drawings, in which:

FIG. 5 illustrates a sectional view of a conventional integrated circuit, that might be manufactured according to the principles of the present invention.

DETAILED DESCRIPTION

Figure 1:
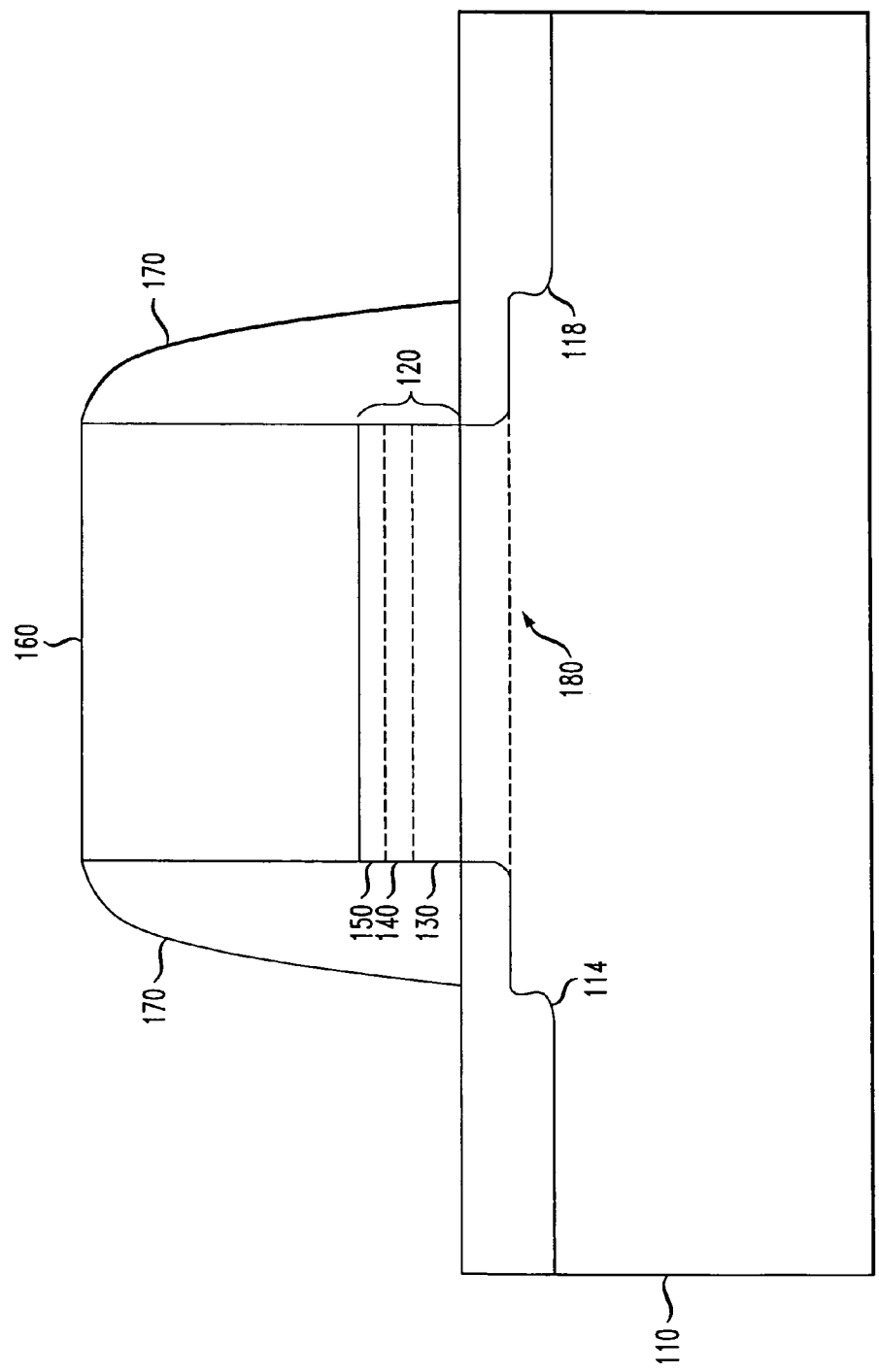
FIG. 1 illustrates a cross-sectional view of a completed semiconductor device manufactured by the method described herein.

Referring initially to FIG. 1, illustrated is a cross-sectional view of a completed semiconductor device 100 manufactured by the method described herein. The semiconductor device 100 includes a semiconductor wafer substrate 110, a source region 114 and a drain region 118. It should be noted that the semiconductor wafer substrate 110 may be any layer located in the semiconductor device 100. Also included in the semiconductor device 100 is a gate dielectric 120 located over the semiconductor wafer substrate 110. The gate dielectric 120 includes a dielectric layer 130 and a nitrided layer 150, with a nitrided transition region 140 located therebetween. Typically the dielectric layer 130 and the nitrided layer 150 have thicknesses ranging from about 0.5 nm to about 2.0 nm, and from about 0.25 nm to about 1.0 nm, respectively. Also included in the semiconductor device 100 is a gate 160 located over the gate dielectric 120, and oxide spacers 170.

The semiconductor device 100 manufactured according to the method described below does not experience the problems associated with semiconductor devices manufactured using prior art methods. For example, the nitrided transition region 140 is located between the dielectric layer 130 and the silicon substrate 110. Thus, the nitrided transition region 140 does not contact the silicon substrate 110 as in prior art methods and the nitrided transition region 140 is a sufficient distance from the silicon substrate 110 such that a substantial amount of boron does not diffuse into the channel region 180. As such, the nitrided transition region substantially inhibits dopants, especially boron, from penetrating into the channel region 180. As a benefit of the present invention, gate dielectrics having thicknesses approaching about 0.75 nm, which accommodates 50 nm devices, can be manufactured. This is about 2 to about 3 device generations smaller than those currently available, and these ultra thin gate dielectrics can be used without the problem of boron diffusing into the channels region 180. Moreover, the dielectric layer 130, including the nitrided transition region 140, can be manufactured easily, and it also benefits from ultra thickness uniformity gained from the slow re-oxidation of the dielectric layer 130, as discussed below.

Figure 2:
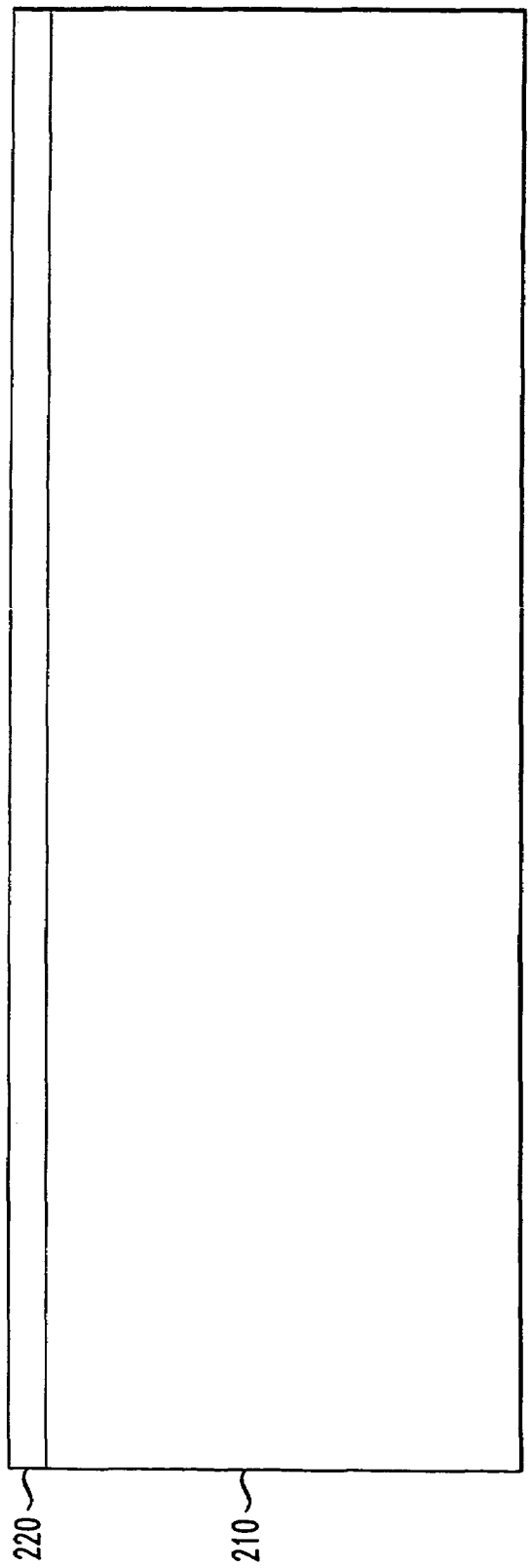
FIG. 2 illustrates a partially completed semiconductor device including a semiconductor wafer substrate and a nitrided layer.

Turning to FIGS. 2–5, illustrated are various stages of manufacture of the completed semiconductor device 100 illustrated in FIG. 1. FIG. 2 illustrates a partially completed semiconductor device 200 including a semiconductor wafer substrate 210. Located over the semiconductor wafer substrate 210 is a nitrided layer 220. The nitrided layer 220 typically comprises a silicon nitride layer that is formed by nitridation of the silicon semiconductor wafer substrate 210. Generally, a thermal or plasma enhanced process is used, but other similar techniques could also be used for nitridation of the silicon substrate 210. Where the thermal enhanced process is used, the silicon substrate 210 is subjected to $NH_3$ gas for a period of time ranging from about 1 minute to about 1 hour, while being subjected to a temperature ranging from about 700° C. to about 1000° C. However, if the plasma nitridation process is used to form the nitrided layer 220, the silicon substrate 210 is subjected to $NH_3$ gas for a period of time ranging from about 10 second to about 10 minutes, while being subjected to a temperature ranging from about 300° C. to about 550° C., a plasma power ranging from about 10 watts to about 100 watts and a chamber pressure ranging from about 1 torr to about 100 torr.

Figure 3:
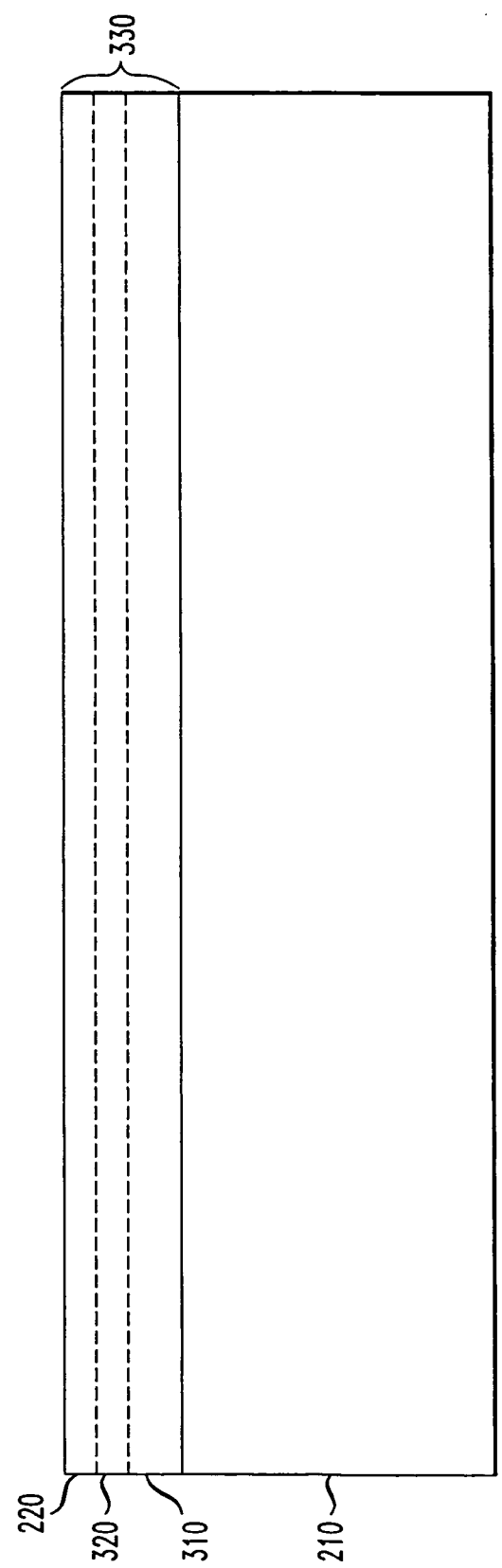
FIG. 3 illustrates the partially completed semiconductor device illustrated in FIG. 2 after a high pressure re-oxidation process.

Turning to FIG. 3, illustrated is the partially completed semiconductor device 200 illustrated in FIG. 2 after a high pressure re-oxidation process. The high pressure re-oxidation process is generally conducted at a pressure substantially greater than 1 atmosphere, for example a pressure ranging from about 5 atmosphere to about 25 atmosphere. In one advantageous embodiment the high pressure re-oxidation process is conducted at about 25 atmosphere. This has distinct advantages over conventional processes. For example, in a typical conventional process, re-oxidation is performed at a pressure of 1 atmosphere or below. This tends to form the nitrided transition region at the gate/nitride interface, which is not sufficiently deep to adequately prevent boron diffusion in the device. (FIG. 1) Moreover, using a pressure of 1 atmosphere or below provides an uneven penetration of oxygen through the nitride that causes uneven oxidation of the underlying silicon, which can degrade device performance. Typically, the high pressure re-oxidation process is performed by supplying a uniform amount of oxygen at a temperature ranging from about 700° C. to about 1000° C. for a time ranging from about 1 minute to about 1 hour.

As illustrated in FIG. 3, the re-oxidation process forms a dielectric layer 310, such as silicon dioxide, in the silicon substrate 210 and below the nitrided layer 220. The re-oxidation process also forms a nitrided transition region 320 between the dielectric layer 310 and the nitrided layer 220. In an advantageous embodiment the nitrided transition region 320 is formed simultaneously with the dielectric layer 310. The nitrided transition region 320, in an alternative advantageous embodiment, may be an oxynitrided transition region, and in a most advantageous embodiment, the nitrided transition region 320 is an oxynitrided boron diffusion interface. It should also be noted that there is substantially no interfacial charge at the nitrided transition region 320, which is in stark contrast to the prior art semiconductor devices. As illustrated, the combination of the nitrided layer 220, the nitrided transition region 320 and the dielectric layer 310 comprise a gate dielectric 330.

Figure 4:
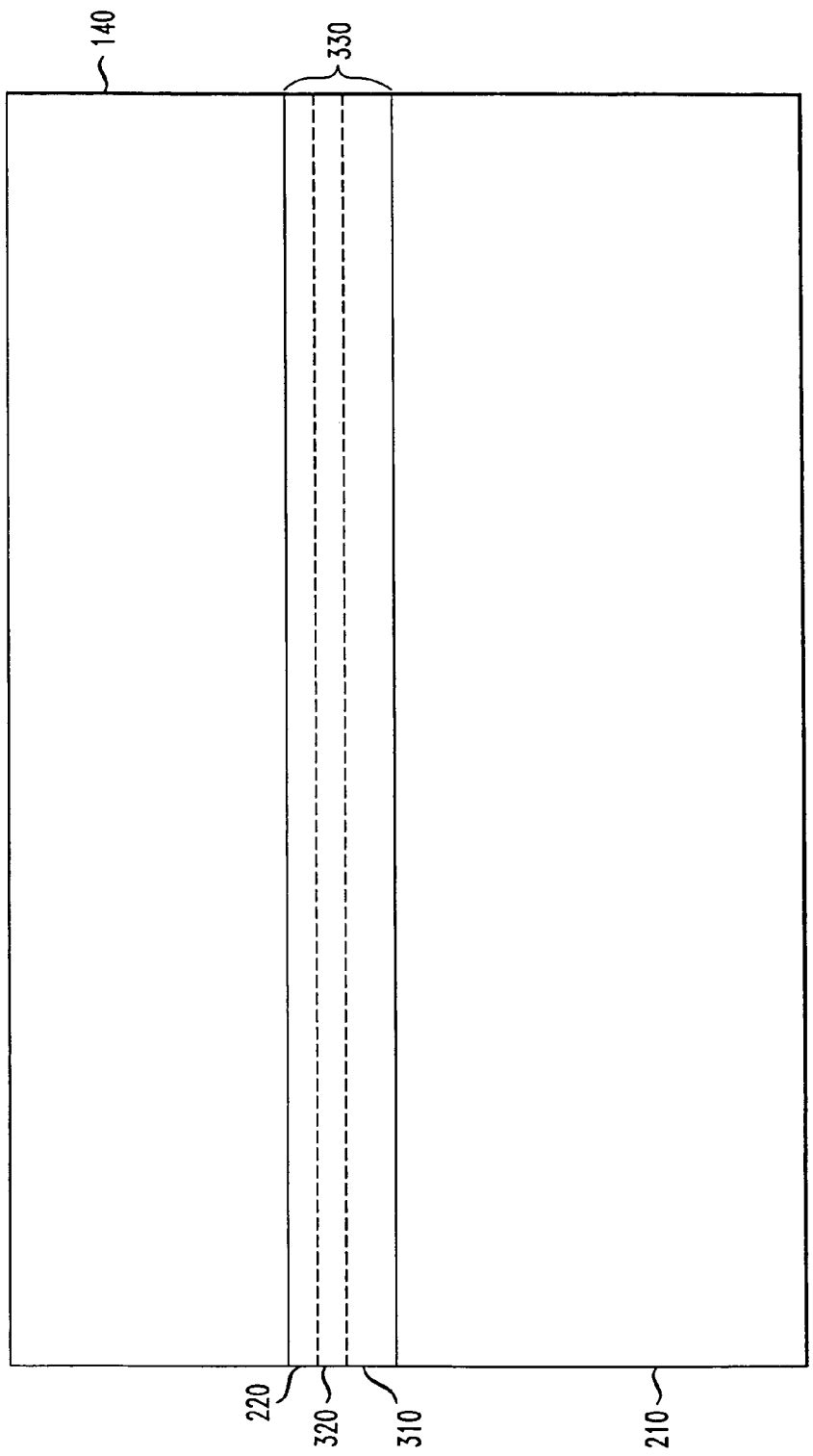
FIG. 4 illustrates the conventional formation of a gate layer over a gate dielectric.

Turning briefly to FIG. 4, illustrated is the conventional formation of a gate layer 410 over the gate dielectric 330. Typically the gate layer 410 comprises a material commonly being used as a poly-gate material, for example polysilicon. Furthermore, the gate layer 410 is typically conductively doped with, for example, boron for p-type devices. After formation and doping of the gate layer 410, a layer of photoresist is conventionally deposited on the gate layer 410. Then, the photoresist is patterned and developed. The partially completed semiconductor device 200 then undergoes a traditional anisotropic etch to remove unprotected portions of the gate layer 410, nitrided layer 220, dielectric layer 310 and nitrided transition region 320. While the method of etching the gate layer 410 is briefly discussed above, one who is skilled in the art understands how to perform such a process.

After etching the unprotected portions, the remaining photoresist is stripped and the semiconductor device 200 is typically subjected to a lightly doped (LDD) source/drain implant. Typically, wherein boron is the dopant, the semiconductor device 200 is a PMOS device that will have a p-type channel formed during operation. After the LDD implant, a conventionally formed tetraethylorthosilicate (TEOS) spacer layer is deposited and an anisotropic spacer etch is performed on the TEOS spacer layer, to form oxide spacers 170 (FIG. 1). After formation of the oxide spacers 170 (FIG. 1) the partially completed semiconductor device 200 undergoes a standard source/drain implant. What results is the completed semiconductor device as previously illustrated in FIG. 1.

Turning briefly to FIG. 5 with continued reference to FIG. 1, there is illustrated a sectional view of a conventional integrated circuit 500, that might be manufactured according to the principles of the present invention. The integrated circuit 500 may include CMOS devices, BiCMOS devices, Bipolar devices, EEPROM devices, including Flash EPROMS, or any other type of similar device. Also shown in FIG. 5, are components of the conventional integrated circuit 500, including: the semiconductor wafer substrate 110, the source region 114 and the drain region 118, the semiconductor device 100, including the dielectric layer 130, the nitrided transition region 140, the nitrided layer 150, the gate 160, and the oxide spacer 170. Also included in the integrated circuit 500 are interlevel dielectrics 520 and interconnects 530. The interconnects 530 electrically connect the semiconductor device 100 to form the integrated circuit 500.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device on a semiconductor substrate, comprising:
    forming a nitrided transition region between a nitrided layer and a dielectric layer of a gate dielectric located over a substrate of a semiconductor wafer, wherein forming the nitrided transition region includes subjecting the substrate to en oxidation process using a pressure substantially greater than about 1 atmosphere; and
    forming a gate over the gate dielectric.

2. The method as recited in claim 1 including forming the dielectric layer wherein the dielectric layer is a silicon dioxide layer.

3. The method as recited in claim 1 including forming the nitrided layer prior to forming the nitrided transition region.

4. The method as recited in claim 3 wherein forming the nitrided layer includes forming the nitrided layer using a plasma or thermal enhanced process.

5. The method as recited in claim 4 wherein forming the nitrided layer includes forming a silicon nitride layer.

6. The method as recited in claim 3 further including forming the dielectric layer subsequent to forming the nitrided layer.

7. The method as recited in claim 6 wherein forming the dielectric layer end the nitrided transition region layer includes forming the dielectric layer and the nitrided transition region simultaneously.

8. The method as recited in claim 1 wherein forming a nitrided transition region includes forming an oxynitrided transition region.

9. The method as recited in claim 8 wherein forming an oxynitrided transition region includes forming an oxynitrided boron diffusion interface.

10. The method as recited in claim 1 including forming the nitrided layer to a thickness ranging from about 0.25 nm to about 1 nm.

11. The method as recited in claim 1 including forming the dielectric layer to a thickness ranging from about 0.5 nm to about 2.0 nm.

12. The method as recited in claim 1 wherein forming a nitrided transition region includes subjecting the substrate to a high pressure oxidation process to form the nitrided transition region and the dielectric layer.

13. The method as recited in claim 1 wherein subjecting the substrate to a pressure substantially greater than 1 atmosphere includes subjecting the substrate to a pressure of about 25 atmosphere.

14. The method as recited in claim 1 wherein forming a nitrided transition region includes forming a nitrided transition region having substantially no interfacial charge.

15. A method of manufacturing an integrated circuit comprising:
    forming a semiconductor device, including,
        forming a nitrided transition region between a nitrided layer and a dielectric layer of a gate dielectric located over a substrate of a semiconductor wafer, wherein forming the nitrided transition region includes subjecting the substrate to an oxidation process using a pressure substantially greater than about 1 atmosphere; and
        forming a gate over the gate dielectric; and
    forming interconnects contacting the semiconductor device to form an integrated circuit.

16. The method as recited in claim 15 including forming the dielectric layer wherein the dielectric layer is a silicon dioxide layer.

17. The method as recited in claim 16 wherein forming the dielectric layer and the nitrided transition region layer includes forming the dielectric layer and the nitrided transition region simultaneously.

18. The method as recited in claim 17 including forming the nitrided layer prior to forming the nitrided transition region.

19. The method as recited in claim 18 wherein forming the nitrided layer includes forming the nitrided layer using a plasma or thermal enhanced process.

20. The method as recited in claim 19 wherein forming the nitrided layer includes forming a silicon nitride layer.

21. The method as recited in claim 15 wherein an oxynitrided transition region includes forming an oxynitrided boron diffusion interface.

22. The method as recited in claim 15 wherein subjecting the substrate to a pressure of substantially greater than about 1 atmosphere includes subjecting the substrate to a pressure ranging from about 5 atmosphere to about 25 atmosphere.

23. The method as recited in claim 15 wherein forming a semiconductor device includes forming a semiconductor device selected from the group consisting of:
    a Bipolar device,
    a BiCMOS device, and
    a CMOS device.

* * * * *